US007442327B2

(12) United States Patent
Thetford et al.

(10) Patent No.: US 7,442,327 B2

(45) Date of Patent: Oct. 28, 2008

(54) USE OF DISPERSIONS IN MAKING ELECTRONIC DEVICES

(75) Inventors: Dean Thetford, Blackley Greater Manchester (GB); John David Schofield, Blackley Greater Manchester (GB)

(73) Assignee: The Lubrizol Corporation, Wickliffe, OH (US)

( * ) Notice: Subject to any disclaimer, the term of this patent is extended or adjusted under 35 U.S.C. 154(b) by 374 days.

(21) Appl. No.: 10/548,052

(22) PCT Filed: Mar. 5, 2004

(86) PCT No.: PCT/US2004/007345

§ 371 (c)(1), (2), (4) Date: Sep. 2, 2005

(87) PCT Pub. No.: WO2004/078333

PCT Pub. Date: Sep. 16, 2004

(65) Prior Publication Data

US 2006/0189502 A1 Aug. 24, 2006

(30) Foreign Application Priority Data

Mar. 5, 2003 (GB) ................................ 0304941.8

(51) Int. Cl.

*H01B 1/00* (2006.01)
*H01B 1/02* (2006.01)
*H01B 1/06* (2006.01)
*H01B 1/22* (2006.01)

(52) U.S. Cl. ....................... 252/500; 252/513; 252/514; 252/510

(58) Field of Classification Search ................. 252/500, 252/510, 512, 513, 514

See application file for complete search history.

(56) References Cited

U.S. PATENT DOCUMENTS

| | | | | |
|---|---|---|---|---|
| 4,224,212 | A * | 9/1980 | Topham | 524/190 |
| 4,826,631 | A * | 5/1989 | Sullivan | 252/512 |
| 4,950,423 | A * | 8/1990 | Sullivan | 252/512 |
| 5,166,229 | A * | 11/1992 | Nakano et al. | 523/447 |
| 5,591,789 | A * | 1/1997 | Iruvanti et al. | 523/515 |
| 5,700,395 | A * | 12/1997 | Thetford et al. | 516/31 |
| 5,753,022 | A | 5/1998 | Schofield et al. | |
| 6,406,513 | B2 * | 6/2002 | Yamaguchi et al. | 75/255 |
| 6,515,061 | B1 | 2/2003 | Iruvanti et al. | |

FOREIGN PATENT DOCUMENTS

| | | |
|---|---|---|
| WO | WO 00/24503 A1 | 5/2000 |
| WO | WO 01/21298 A1 | 3/2001 |

* cited by examiner

*Primary Examiner*—Mark Kopec
*Assistant Examiner*—Jaison P Thomas
(74) *Attorney, Agent, or Firm*—Samuel B. Laferty

(57) ABSTRACT

Dispersions useful in making capacitors, printed circuit boards, etc., comprising an electronic particulate solid, a carrier and a dispersant of formula (1): R—(O-A-CO)x(O—B—CO)y-Z wherein R is hydrogen or a polymerisation terminating group; A is C8-20-alkylene and/or C8-20-alkenylene; B is C1-6-alkylene or a lactone thereof; Z is hydroxyl or a basic group or a moiety containing a basic group; x is from 2 to 45; Y is from 0 to 15; and the ration of x:y is not less than 3:1, the carrier is a high boiling organic liquid having a boiling point between 150 and 350° C. selected from monohydric alcohols and esters of dialkylene glycol monoalkyl esters.

13 Claims, No Drawings

USE OF DISPERSIONS IN MAKING ELECTRONIC DEVICES

This application claims priority to Great Britain patent application number 0304941.8 filed Mar. 5, 2003.

FIELD OF INVENTION

This application discloses improved dispersants for use in dispersing dielectric material and conductive metal materials for use in making capacitors, printed circuit boards and similar electronic devices wherein various patterns of conductive channels separated by a dielectric material are useful.

BACKGROUND OF INVENTION

WO 94/21368 discloses various dispersants similar to the dispersants taught herein.

SUMMARY OF INVENTION

A use of a dispersant to manufacture electrical devices wherein the dispersion comprises an electronic particulate solid, a carrier and a dispersant of the formulae

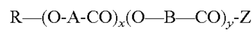

$$R—(O\text{-}A\text{-}CO)_x(O—B—CO)_y\text{-}Z \quad 1$$

wherein

R is hydrogen or a polymerisation terminating group;

A is $C_{8-20}$-alkylene and/or $C_{8-20}$-alkenylene;

B is $C_{1-6}$-alkylene, e.g. (O—B—CO) may be derived from a lactone;

Z is hydroxyl or a basic group or a moiety containing a basic group;

x is from 2 to 45;

y is from 0 to 15; and the ratio of x:y is not less than 3:1.

The polyester chain represented by $R—(O\text{-}A\text{-}CO)_x(O—B—CO)_y—$ may be block or preferably random and either moiety represented by (O-A-CO) or (O—B—CO) may be directly attached to R. However, it is preferred that the group (O-A-CO) is attached to R is described.

DETAILED DESCRIPTION OF THE INVENTION

The present invention relates to the use of certain dispersions containing an electronic particulate solid dispersed in a carrier and the use of such dispersions for making electronic devices such as capacitors and printed circuit boards.

Multi-layer ceramic capacitors are well-known in the art and are generally made by applying a finely divided dielectric material to a substrate and superimposing thereon a layer of finely divided conductive metal such as silver in a desired pattern to serve as capacitor electrode or plate. Multi-layer ceramic capacitors are made from alternating layers of dielectric material and conducting material with the two outermost layers composed of dielectric material. The composite sandwich of alternating layers of dielectric material and conducting material is then fired at the fusing or sintering temperature of the dielectric material, often under pressure, to form a monolithic capacitor structure. During this fusing or sintering process the various components used to uniformly distribute the dielectric material and the conducting material in the different layers are "burnt out". The dielectric layer and the conducting layer are generally prepared from dispersions of dielectric material and conducting material in a carrier, which is generally a non-polar organic liquid. In order to uniformly distribute the electronic particulate solid in the carrier a dispersant is preferably used and this dispersant must be carefully selected in order to avoid separation of the electronic particulate solid in the carrier and to provide for efficient removal during the subsequent firing process.

It has now been found that the use of polyesteramine dispersants derived from ricinoleic acid and polyethyleneimine are particularly effective in dispersing electronic particulate solids in the non-polar organic liquid carriers used in the fabrication of electronic capacitors and that such dispersants may be subsequently removed during a firing process without causing any deleterious effect in the final capacitor.

According to the present invention there is provided the use of a dispersion in the manufacture of an electrical device wherein the dispersion comprises an electronic particulate solid, a carrier and a dispersant of formula 1.

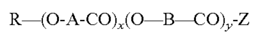

$$R—(O\text{-}A\text{-}CO)_x(O—B—CO)_y\text{-}Z \quad 1$$

wherein

R is hydrogen or a polymerisation terminating group;

A is $C_{8-20}$-alkylene and/or $C_{8-20}$-alkenylene;

B is $C_{1-6}$-alkylene, e.g. (O—B—CO) may be derived from a lactone;

Z is hydroxyl or a basic group or a moiety containing a basic group;

x is from 2 to 45;

y is from 0 to 15; and the ratio of x:y is not less than 3:1.

The polyester chain represented by $R—(O\text{-}A\text{-}CO)_x(O—B—CO)_y—$ may be block or preferably random and either moiety represented by (O-A-CO) or (O—B—CO) may be directly attached to R. However, it is preferred that the group (O-A-CO) is attached to R.

Preferably, the ratio of x:y is not less than 5:1, more preferably not less than 8:1 and especially not less than 10:1. It is especially preferred that y is zero.

When R is a polymerisation terminating group it is preferably the residue of a carboxylic acid $R^1$—COOH wherein $R^1$ may be aryl, heteroaryl, cycloalkyl or preferably alkyl and may be substituted by halogen, $C_{1-6}$-alkoxy, amino or ether groups. Preferably $R^1$ is unsubstituted. When $R^1$ is alkyl it may be linear or branched, saturated or unsaturated but is preferably saturated.

The total number of carbon atoms in R can be as high as 50 but it is preferred that R contains not less than 8, more preferably not less than 12 and especially not less than 14 carbon atoms. It is also preferred that R contains not greater than 30, more preferably not greater than 24 and especially not greater than 20 carbon atoms.

Examples of carboxylic acids of formula $R^1$—COOH are acetic acid, methoxy acetic acid, caproic acid, oleic acid, lauric acid, decanoic acid, dodecanoic acid, stearic acid and palmitic acid. Examples of branched alkyl carboxylic acids are 2-ethylbutyric, 2-ethylhexanoic, 2-butyloctanoic, 2-hexyldecanoic, 2-octyldodecanoic and 2-decyltetra decanoic acids. Branched aliphatic acids are also available under the trademark Isocarb (ex Sasol) and specific examples are Isocarb 12, 16, 20, 28, 32, 34T and 36. Mixtures of carboxylic acids may be used. The unsaturated hydroxy carboxylic acids which are represented by the group (CO-A-O) may contain an alkyl or alkenyl carboxylic acid and this may act as a polymerisation terminating group. This is particularly true where the hydroxy carboxylic acid is derived from natural products.

Preferably, A contains not less than 12 and especially not less than 14 carbon atoms. Examples of hydroxy carboxylic acids from which the group (CO-A-O) may be derived are ricinoleic acid, 12-hydroxy stearic acid, 12-hydroxy dodecanoic acid, 5-hydroxy dodecanoic acid, 5-hydroxy decanoic acid and 4-hydroxy decanoic acid. It is especially preferred that (CO-A-O) is the residue of ricinoleic acid.

The alkylene residue represented by B may be linear or branched. Examples of hydroxy carboxylic acids from which (CO—B—O) is derived are glycolic acid, 6-hydroxy caproic acid and 5-hydroxyvaleric acid.

Examples of lactones are β-propiolactone and optionally alkyl-substituted ∈-caprolactone and optionally alkyl-substituted δ-valerolactone. The alkyl substituent is preferably $C_{1-6}$-alkyl and especially $C_{1-4}$-alkyl which may be linear or branched. The alkyl substituted ∈-caprolactone may be obtained by the oxidation of alkyl substituted cyclohexanone as described in WO 98/19784. Examples include 7-methyl-, 3-methyl-, 5-methyl-, 6-methyl-, 4-methyl-, 5-tert.butyl-, 4,6,6-trimethyl- and 4,4,6-trimethyl ∈-caprolactone. An example of alkyl substituted valerolactone is β-methyl-δ-valerolactone. Preferred lactones are ∈-caprolactone and δ-valerolactone.

Mixtures of hydroxy carboxylic acids and lactones may be used.

Preferably, y is not greater than 6, more preferably not greater than 4, even more preferably not greater than 2 and is especially zero.

The weight ratio of the polyester chain R—(O-A-CO)$_x$(O—B CO)— to Z is preferably not less than 5 and especially not less than 8. It is also preferred that the weight ratio of the polyester chain to Z is not greater than 30, more preferably not greater than 20 and especially not greater than 15. Particularly useful dispersants are those wherein the weight ratio of the polyester chain R—(O-A-CO)$_x$(O—B—CO)$_y$— to Z is from 8 to 15.

Z is preferably the residue of a polyamine or polyimine such as polyallyl amine, polyvinyl amine, more preferably poly($C_{2-4}$-alkylene imine) (hereinafter PAI) and especially poly(ethylene imine) (hereinafter PEI).

Linear polyethylene imines can be prepared by the hydrolysis of poly(N-acyl) alkylene imines as described by Takeo Saegusa et al in Macromolecular, 1972, Vol 5, page 4470. Branched polyethylene imines of differing molecular weights are available from BASF and Nihon Shokubai. Polyallylamine and poly(N-alkyl) allylamines of differing molecular weights are available from Nitto Bonseki. Polyvinyl amines are available from Mitsubishi Kasei. Poly(propylene imine) dendrimers are available from DSM Fine Chemicals and poly(amido amine) dendrimers are available as "Starburst" dendrimers from Aldrich Chemical Company.

The polyamine or polyimine preferably has a weight-average molecular weight from 500 to 600,000, more preferably from 1,000 to 200,000, even more preferably from 1,000 to 100,000 and especially from 1,000 to 70,000.

The number-average molecular weight of the polyester moiety represented by R—(O-A-CO)$_x$(O—B—CO)$_y$— is preferably from 600 to 4,000 and especially from 800 to 2,000.

The polyester chain moiety represented by R—(O—CO)$_x$(O—B—CO)$_y$— may be linked to the polyamine or polyimine component Z by either a covalent amide group —CON=formed between a terminal carbonyl group of the polyester chain and the nitrogen atom of a primary or secondary amine group in the polyamine or polyimine or through a salt linkage —$COO^-HN^+$≡ formed between a terminal carboxylic acid group of the polyester chain and an ammonium group in the polyamine or polyimine.

Preferably, the dispersant contains a plurality of polyester chains attached to the polyamine or polyimine and consequently may contain a mixture of amide and salt linkages depending on the severity of the reactor conditions.

The dispersant may also be conveniently represented by general formula 2.

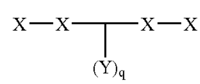

2 wherein

X-x-x-X represents the polyamine or polyimine;

Y represents the polyester chain moiety R—(O-A-CO)$_x$(O—B—CO)$_y$—; and q is from 4 to 2,000.

Preferably q is not less than 10. It is also preferred that q is not greater than 1,000 and especially not greater than 500.

The dispersants may be prepared by any method known to the art and are more typically made by the process described in WO 94/21368.

The electronic particulate solid in the dispersion may be any dielectric solid or conducting solid, including mixtures thereof which are used in the fabrication of electronic or electrical devices.

The conducting solid is preferably a metal which may be a powder or flake but is preferably a micronised powder. The particle size of the metal is preferably not greater than 3μ and especially not greater than 1μ. Examples of conducting metals are copper, silver, gold, palladium, platinum, ruthenium, rhodium, osmium, iridium and nickel including mixtures and alloys thereof.

Nickel and silver are preferred metals.

The dielectric solid may be any non-electrically conducting solid and is preferably a metal oxide or inorganic metal derivative containing oxygen. Examples of suitable dielectric solids are glass, barium titanate, lead zirconate, bismuth stannate, titanium dioxide, lead-magnesium niobate, lead oxide, potassium carbonate, magnesium carbonate, lithium carbonate, strontium nitrate, barium-strontium-titanate, bismuth oxide and aluminium oxide and mixtures thereof. Generally, any non-conducting solids may be used which can be fused or sintered to provide a continuous dielectric layer. The particle size of the dielectric solid may be fairly coarse in nature but if it is to be incorporated into the dispersion with the conducting metal the particle size is preferably not greater than 5μ, more preferably not greater than 3μ and especially not greater than 1μ.

The carrier in the dispersion is an organic or preferably a mixture of organic liquids which is also preferably free from water. The organic liquid may be polar or preferably non-polar and is especially a high boiling organic liquid having a boiling point between 150° C. and 350° C. Preferably the boiling point is not less than 180° C. and especially not less than 200° C. It is also preferred that the boiling point is not greater than 300° C. and especially not greater than 280° C.

Preferred high boiling organic liquids are monohydric alcohols such as octanol, decanol, dodecanol, tetradecanol, terpineol (including its stereo isomers) and dialkyleneglycol mono alkyl ethers such as diethylglycol mono alkyl ethers, especially $C_{1-6}$-monoalkyl ethers for example diethyleneglycol monobutyl ether. Other preferred high boiling organic liquids are esters of dialkylene glycol monoalkyl ethers such as butyl carbitol acetate (2-(2-butoxyethoxy)ethyl acetate).

Terpineol is the preferred high boiling organic liquid.

For ease of handling, the dispersant is preferably made available as a solution in the carrier. Therefore, according to a further aspect of the invention there is provided a composition comprising a high boiling organic liquid having a boiling point between 150° C. and 350° C. and a dispersant of formula 1.

Preferably the high boiling organic liquid is an aromatic hydrocarbon such as naptha or preferably a mono hydric alcohol and is especially terpineol including isomeric mixtures thereof.

The composition may further comprise an electronic particulate solid which is preferably a metal and/or dielectric solid. Preferred metals are silver and nickel. A preferred dielectric solid is barium titanate.

The amount of electronic particulate solid in the composition is preferably from 20% to 90% based on the total amount of the composition. It is also preferred that the amount of electronic particulate solid is not less than 40% and especially not less than 50% based on the total amount of the composition. Particularly useful compositions are those containing from 50 to 70% electronic particulate solid.

The amount of dispersant in the composition can vary over a wide range but it is preferably from 1% to 150% based on the amount of electronic particulate solid. Preferably, the amount of dispersant is not greater than 100%, more preferably not greater than 50% and especially not greater than 20% based on the amount of the electronic particulate solid. Useful dispersions have been found wherein the amount of dispersant is from 2 to 10% by weight of the electronic particulate solid.

The viscosity of the composition may also be adjusted by adding other adjuvants such as a binder resin to adapt the composition for the intended end-use.

Preferably the binder resin is soluble in the carrier. The binder resin is preferably derived from a natural product such as rosin or cellulose. Examples of suitable binder resins are hydrogenated rosin, glycerin esters of hydrogenated rosin, ethyl cellulose and ethyl hydroxy ethyl cellulose.

Thus, when the composition is to be used as a printing ink, especially a screen printing ink for producing electrically conducting tracks in electronic devices such as printed circuit boards (PCBs), capacitors and the like, it is preferable to include a binder resin. The amount of binder resin is preferably from 10% to 40% by weight of the carrier or liquid phase which is equivalent to from 4% to 16% of the total composition by weight.

When the composition is used for fabricating a conducting electrical track using a screen printing technique, it preferably constitutes a viscous ink and especially an ink having a viscosity between 10,000 and 70,000 cps at 25° C. The ink preferably also contains an inert organic liquid such as an aliphatic hydrocarbon, especially one containing from 6 to 16 carbon atoms. Examples of aliphatic hydrocarbons are gasoline, hexane, heptane, octane, decane, dodecane, hexadecane and especially kerosene. The amount of inert organic liquid in the ink is preferably from 40 to 65% by weight of the paste.

By inert organic liquid is meant any organic liquid which does not interact with the surface of a dielectric substrate, thereby adversely affecting its surface integrity. Preferably, the inert organic liquid has a boiling point from 50° to less than 150° C.

It will also be obvious to those skilled in the art that the viscosity of the ink may be readily varied to render it more suitable for flexographic printing and ink jet printing, such as drop-on-demand ink jet printing.

The ink is generally prepared by dissolving the dispersant and binder resin in the high boiling organic liquid by heating as required. After cooling to 20-25° C., the electronic particulate solid such as nickel or silver is added followed by the aliphatic organic liquid, if present. An appropriate dispersion process such as ball milling, bead milling, high-shear mixing or ultrasonication may then be applied. The ink is then applied to a dielectric substrate by any appropriate means known to the industry, such as by screen printing, to produce a precursive electrically conducting track. The inert organic liquid may optionally be removed by evaporating prior to subjecting the dielectric substrate to heating at a temperature from 600 to 1200° C. during which process the carrier is burnt out and the electrically conducting particulate solid is fused to give an electrically conducting track on the surface of the dielectric substrate. The thickness of the electrically conducting path may be increased by repeating the screen printing process and/or by applying further material by electro deposition as desired.

The composition may also be used as a solder to create electrical connections between components used in making electronic devices such as PCBs by applying the composition to the electrical contacts of the component such as a resistor, capacitor, etc. Similarly, the composition may also be used to create electrical connections between different electrical conducting tracks by filling vias with the composition. The electrical bridge may be completed by firing at high temperature as described above.

The composition may also be used in the manufacture of capacitors where the composition is applied to either a "green" flexible dielectric body or substrate or a fired rigid dielectric substrate.

The term "green" when applied to a dielectric substrate means a substrate which has not been exposed to high temperature which results in the fusing together or sintering of the dielectric particulate solids which form the dielectric substrate. The green dielectric substrate is often in the form of a self-supporting flexible sheet wherein the dielectric particulate solids are held together by a polymeric organic binder. The green dielectric substrate is printed with the above composition containing a conducting electronic particulate solid (e.g. a metal). The printed dielectric substrate is then cut into sections and the sections arranged in superimposed layers where the conducting printed track projects on the same side for alternate layers and where the top layer is devoid of the printed track. The layers are then compressed under a pressure of 300 to 2000 psi and then fired at high temperature of 600-1200° C. to form a monolithic capacitor having projecting electrical contacts.

Where the capacitor contains a relative low number of conducting layers, e.g. two layers, surrounded by dielectric material, the capacitor is known as embedded and such embedded capacitors may also be fabricated using the dispersion according to the invention.

The composition may also be applied to a fired rigid dielectric substrate. However, in this case the composition may contain higher levels of high boiling organic liquid since the fired substrate is much more resistant to such organic liquids compared with a green substrate. When the composition is applied to a fired dielectric substrate it is often beneficial to include up to 20% by weight of the composition of dielectric particulate solid(s) so that after firing the conducting electronic particulate solid forms a conducting body which is held within a fused or sintered body of dielectric material. The fired dielectric material may be in the form of an inorganic chip.

The composition may also be used to provide a heating element for the demisting of glass used in the manufacture of vehicles.

Where the electronic particulate solid is a dielectric material such as barium titanate, the composition may be used to fix electronic components to a substrate such as a PCB by non-electrically conducting adhesion. The composition may contain a binder resin and inert organic liquid as described hereinbefore. After firing, a non-electrically conducting weld is formed between the electronic component and substrate.

The composition containing the dielectric material may be applied either locally or to the total surface of the substrate. When applied to the total surface the composition may be advantageously applied by doctor blade. When applied locally the composition may be usefully applied as an ink after appropriate adjustment of viscosity.

The invention is now described in further detail with reference to the following examples wherein all references are in parts by weight unless expressed to the contrary.

Dispersants used in the Examples

| Dispersant | Polyester chain (PC) | Polyimine (PI) | Ratio of PC:PI |
|---|---|---|---|
| 1 | PHS | SP200 | 10:1 |
| 2 | PRA | SP200 | 10:1 |
| 3 | RA:Cap (4:1) | SP200 | 9:1 |
| 4 | PHS | — | — |
| 5 | PRA | — | — |
| 6 | PRA | — | — |
| 7 | RA:HSA (1:1) | SP200 | 14:1 |
| 8 | PRA | SP200 | 18:1 |
| 9 | PRA | SP200 | 20:1 |
| 10 | PRA | SP050 | 7:1 |

In the above table, PHS is poly (12-hydroxystearic acid), PRA is polyricinoleic acid, RA is ricinoleic acid, cap is ∈ -caprolactone, HSA is 12-hydroxystearic acid, SP200 is polyethylene imine with a number average molecular weight of 10,000, and SP050 is polyethylene imine with a number average molecular weight of 5000.

The numbers in parenthesis in the polyester chain column for Dispersant 3 indicate the molar ratio of ricinoleic acid to ∈ -caprolactone in the polyester chain. The numbers in the PC:PI column indicate the weight average ratio of polyester chain to polyethylene imine.

Dispersants 1 to 10 are all made by a similar process to that described in WO 94/21368. Dispersant 4 is identical to Polyester A whose preparation is also described in WO 94/21368. Dispersants 5 and 6 are made by a similar process to that use in WO 94/21368 for Polyester A. Dispersant 5 has a molecular weight of 870. Dispersant 6 has a molecular weight of 1100. Dispersant 7 has a polyester chain of molecular weight of 1600 containing both ricinoleic acid and 12-hydroxystearic acid in a 1:1 mole ratio. Dispersant 8 and 9 has a polyester chain of molecular weight of 1100. Dispersant 10 has a polyester chain of molecular weight of 1600.

EXAMPLES 1 TO 12

The dispersant (250 parts) was dissolved in a mixture of Terpineol isomers (250 parts ex Fisher) by stirring together at 120° C. under nitrogen for 1 hour. After cooling to 20° C. a dispersion was prepared by milling an electronic particulate solid in the solution of dispersant in Terpineol diluted with more Terpineol using a horizontal shaker in the presence of 3 mm diameter glass balatini beads (17 parts) for 16 hours. The viscosity of the dispersion was assessed by hand shaking using an arbitrary scale of A to D (good to poor). The results are given in Table 1A-! below.

TABLE 1A

| Example | Dispersant | Amount of Dispersant | Ni | $BaTiO_3$ | Terpineol diluent | Viscosity |
|---|---|---|---|---|---|---|
| 1 | 1 | 0.2 | 7 | — | 2.8 | B/C |
| 2 | 2 | 0.2 | 7 | — | 2.8 | C |
| 3 | 3 | 0.2 | 7 | — | 2.8 | B/C |
| 4 | 4 | 0.2 | 7 | — | 2.8 | B |
| A | — | — | 7 | — | 3.0 | C/D |
| 5 | 1 | 0.2 | — | 5 | 4.8 | A/B |
| 6 | 2 | 0.2 | — | 5 | 4.8 | B |
| 7 | 3 | 0.2 | — | 5 | 4.8 | A/B |

TABLE 1A-continued

| Example | Dispersant | Amount of Dispersant | Ni | $BaTiO_3$ | Terpineol diluent | Viscosity |
|---|---|---|---|---|---|---|
| 8 | 4 | 0.2 | — | 5 | 4.8 | A/B |
| B | — | — | — | 5 | 5 | D |
| 9 | 1 | 0.2 | — | 6 | 3.8 | B/C |
| 10 | 2 | 0.2 | — | 6 | 3.8 | C |
| 11 | 3 | 0.2 | — | 6 | 3.8 | B/C |
| 12 | 4 | 0.2 | — | 6 | 3.8 | B/C |
| 13 | 8 | 0.1 | 7 | — | 2.9 | B/C |
| 14 | 10 | 0.1 | 7 | — | 2.9 | B/C |
| 15 | 7 | 0.1 | 7 | — | 2.9 | B/C |
| 16 | 8 | 0.1 | | 5 | 4.9 | A/B |
| 17 | 10 | 0.1 | | 5 | 4.9 | A/B |
| 18 | 7 | 0.1 | | 5 | 4.9 | A/B |
| 19 | 6 | 0.1 | | 5 | 4.9 | A/B |
| 20 | 9 | 0.1 | | 5 | 4.9 | A/B |
| C | — | 0 | | 5 | 5 | D |

Footnote to Table 1:
The amount of Dispersant is a 50/50 w/w mixture of dispersant in a mixture of Isomers of Terpineol.

Ni powder is micronised powder ex Aldrich with particle size below 1μ.

$BaTiO_3$ is micronised barium titanate ex Aldrich with particle size below 1μ.

TABLE 1B

| Example | Dispersant | Amount of Dispersant | Cerium oxide | Terpineol diluent | Viscosity |
|---|---|---|---|---|---|
| D | — | — | 2.5 | 7.5 | B/C |
| 21 | 4 | 0.1 | 2.5 | 7.4 | A/B |
| 22 | 7 | 0.1 | 2.5 | 7.4 | A/B |
| 23 | 3 | 0.2 | 2.5 | 7.3 | A/B |
| 24 | 4 | 0.2 | 2.8 | 7 | B |

Cerium oxide is nanosized available from Aldrich.
MEL3/Zirconia is available from MEL Chemicals.
Okamoor Silica HPF2 is available from Hepworth Minerals & Chemicals.
Alumina AE511C is available from Sumitomo.

TABLE 1C

| Example | Dispersant | Amount of Dispersant | MEL Zirconia | Silica | Terpineol diluent | Viscosity |
|---|---|---|---|---|---|---|
| F | — | — | 4 | — | 6 | C |
| 25 | 5 | 0.1 | 4 | — | 5.9 | A/B |
| 26 | 9 | 0.1 | 4 | — | 5.9 | A/B |
| G | — | — | — | 4.5 | 5.5 | B |
| 27 | 7 | 0.1 | — | 4.5 | 5.4 | A/B |

TABLE 1D

| Example | Dispersant | Amount of Dispersant | Sumitomo Alumina AESIIC | Terpineol diluent | Viscosity |
|---|---|---|---|---|---|
| 1 | — | — | 5 | 5 | B/C |
| 2 | 10 | 0.1 | 5 | 4.9 | B |
| 3 | 9 | 0.1 | 5 | 4.9 | B |

The viscosity of Examples 1-4, 9-12, A and B was also measured at 20° C., after removal of the glass beads, using a Thermal Analyser model $CSL^2$ 500 equipped with a 4 cm cone, 2° face at a 57 micron gap. The results are given in Table 2 below.

TABLE 2

| | | | | | | | | |
|---|---|---|---|---|---|---|---|---|
| | | | | Example 1 | | | | |
| Shear rate 1/s | 1.006 | 5.02 | 9.921 | 20.37 | 52.44 | 107.6 | 506.7 | 1000 |
| Viscosity (Pa · s) | 7.797 | 2.141 | 1.35 | 0.8715 | 0.539 | 0.4048 | 0.2566 | 0.2404 |
| | | | | Example 2 | | | | |
| Shear rate 1/s | 0.9132 | 4.994 | 10.24 | 21.02 | 52.12 | 106.9 | 503.9 | 1033 |
| Viscosity (Pa · s) | 11.49 | 2.403 | 1.434 | 0.9208 | 0.5958 | 0.4426 | 0.2898 | 0.2552 |
| | | | | Example 3 | | | | |
| Shear rate 1/s | 0.9132 | 4.994 | 10.24 | 21.02 | 52.12 | 106.9 | 503.9 | 1033 |
| Viscosity (Pa · s) | 11.49 | 2.403 | 1.434 | 0.9208 | 0.5958 | 0.4426 | 0.2898 | 0.2552 |
| | | | | Example 4 | | | | |
| Shear rate 1/s | 0.8835 | 4.976 | 10.22 | 20.96 | 51.94 | 106.6 | 502.3 | 1030 |
| Viscosity (Pa · s) | 11.94 | 2.373 | 1.448 | 0.926 | 0.5995 | 0.4414 | 0.286 | 0.2508 |
| | | | | Control A | | | | |
| Shear rate 1/s | 1.184 | 4.963 | 10.19 | 20.95 | 54.03 | 106.7 | 503.3 | 1032 |
| Viscosity (Pa · s) | 23.41 | 6.41 | 3.595 | 2.048 | 1.068 | 0.7386 | 0.3688 | 0.3008 |
| | | | | Example 9 | | | | |
| Shear rate 1/s | 1.08 | 4.918 | 10.1 | 20.71 | 53.28 | 109.3 | 495.5 | 1016 |
| Viscosity (Pa · s) | 0.3766 | 0.3732 | 0.3376 | 0.3298 | 0.2932 | 0.273 | 0.2623 | 0.2507 |
| | | | | Example 10 | | | | |
| Shear rate 1/s | 1.018 | 4.839 | 9.864 | 20.28 | 52.53 | 108.1 | 490.9 | 1008 |
| Viscosity (Pa · s) | 4.749 | 3.251 | 3.218 | 3.036 | 2.316 | 1.741 | 0.9097 | 0.6764 |
| | | | | Example 11 | | | | |
| Shear rate 1/s | 1.077 | 5.031 | 9.947 | 20.41 | 52.5 | 107.7 | 507 | 1001 |
| Viscosity (Pa · s) | 0.2944 | 0.3455 | 0.3585 | 0.331 | 0.3106 | 0.2907 | 0.2702 | 0.2655 |
| | | | | Example 12 | | | | |
| Shear rate 1/s | 1.067 | 5.042 | 9.952 | 20.4 | 52.5 | 107.7 | 507.4 | 1002 |
| Viscosity (Pa · s) | 0.2516 | 0.2419 | 0.2376 | 0.2293 | 0.2136 | 0.2001 | 0.1872 | 0.1854 |
| | | | | Control B | | | | |
| Shear rate 1/s | 1.077 | 5.54 | 10.17 | 20.13 | 51.88 | 106.5 | 502.6 | 1031 |
| Viscosity (Pa · s) | 21.62 | 7.663 | 4.677 | 2.763 | 1.386 | 0.8579 | 0.3709 | 0.2773 |

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims. If a polymer is described with a molecular weight without specifying number average or weight average, it should be interpreted as number average.

The invention claimed is:

1. The use of a dispersion in the manufacture of an electrical device comprising the steps of:

a) dispersing an electronic particulate solid in a liquid carrier utilizing a dispersant of formula 1 or formula 2 forming a dispersion, said electronic particulate solid comprising a dielectric material or a conductive material, b) applying said electronic particulate solid from said dispersion as a layer forming a dielectric layer or a electrically conductive track, and c) optionally firing said electronic particulate solid at 600-1200° C., wherein said dispersion comprises an electronic particulate solid, a carrier and a dispersant of formula 1 or formula 2

$$R—(O\text{-}A\text{-}CO)_x(O—B—CO)_y\text{-}Z \quad (1)$$

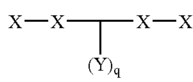

wherein

R is hydrogen or a polymerisation terminating group;

A is $C_{8-20}$-alkylene and/or $C_{8-20}$-alkenylene;

B is $C_{1-6}$-alkylene or a lactone thereof;

Z is hydroxyl or a basic group or a moiety containing a basic group;

x is from 2 to 45;

y is from 0 to 15;

the ratio of x:y is not less than 3:1:

X-x-x-X represents the polyamine or polyimine;

Y represents the polyester chain moiety $R—(O\text{-}A\text{-}CO)_x(O—B—CO)_y—$; and q is from 4 to 2,000 wherein said electrical device comprises various patterns of conductive channels from conductive particulate material separated by a dielectric material formed from dielectric particulate.

2. The use as claimed in claim 1 wherein R is $C_{1-50}$-alkyl which may be linear or branched.

3. The use as claimed in claim 1 wherein (O-A-CO) is the residue of ricinoleic acid.

4. The use as claimed in claim 1 wherein y is 0.

5. The use as claimed in claim 1 wherein the weight ratio of $R—(O\text{-}A\text{-}CO)_x(O—B—CO)_y—$ to Z is from 8 to 15.

6. The use as claimed in claim 1 wherein Z is the residue of a polyamine or polyimine.

7. The use as claimed in claim 6 wherein the polyimine or polyamine is polyallylamine, polyvinylamine or poly($C_{2-4}$-alkylene imine).

8. The use as claimed in claim 7 wherein the poly($C_{2-4}$-alkylene imine) is polyethylene imine.

9. The use as claimed in claim 1 wherein the electronic material comprises a metal selected from copper, silver, gold, platinum, palladium and nickel including mixtures and alloys thereof.

10. The use as claimed in claim 1 wherein the electronic material comprises a dielectric non-conducting solid which can be fused or sintered to form a continuous layer.

11. The use as claimed in claim 10 wherein the dielectric solid is a metal oxide or inorganic metal derivative containing oxygen.

12. The use as claimed in claim 1 wherein the carrier is a high boiling organic liquid having a boiling point between 150 and 350° C.

13. The use of said dispersion in the manufacture of an electrical device as set forth in claim 1, wherein said electrical device comprises a capacitor made using both a dispersion of dielectric material and a dispersion of electrically conductive material.

* * * * *